(12) United States Patent
Yu et al.

(10) Patent No.: US 7,839,713 B1
(45) Date of Patent: Nov. 23, 2010

(54) READING AND WRITING DATA TO A MEMORY CELL IN ONE CLOCK CYCLE

(75) Inventors: Haiming Yu, San Jose, CA (US); Catherine Chingi Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 316 days.

(21) Appl. No.: 11/897,610

(22) Filed: Aug. 31, 2007

(51) Int. Cl.
 *G11C 8/00* (2006.01)
(52) U.S. Cl. .............. 365/230.05; 365/203; 365/189.16
(58) Field of Classification Search ............ 365/230.05, 365/203, 189.16
See application file for complete search history.

(56) References Cited

U.S. PATENT DOCUMENTS 6,665,209 B2 * 12/2003 Osada et al. ................. 365/154
7,372,753 B1 * 5/2008 Rinerson et al. ............ 365/209

OTHER PUBLICATIONS

U.S. Appl. No. 11/506,254, filed Aug. 18, 2006, Yu et al.
U.S. Appl. No. 11/668,347, filed Jan. 29, 2007, Chou et al.

* cited by examiner

*Primary Examiner*—Huan Hoang
(74) *Attorney, Agent, or Firm*—Mauriel Kapouytian & Treffert; Ararat Kapouytian (57) ABSTRACT

A memory circuit, where data is read from and written to the memory cell in one clock cycle via a port without pre-charging the port between reading data from and writing data to the memory cell via the port in the one clock cycle, is described. In one aspect, an embodiment of the present invention provides a memory circuit with a write control switch that has a voltage drop of substantially zero volts. In another aspect, an embodiment of the present invention provides a memory circuit with a write driver that uses a complementary metal oxide semiconductor ("CMOS") inverter whose P-channel MOS ("PMOS") transistor size is approximately 0.5 times its N-channel MOS ("NMOS") transistor size. In yet another aspect, an embodiment of the present invention provides a memory circuit with a latch-type read sense amplifier.

36 Claims, 6 Drawing Sheets

READING AND WRITING DATA TO A MEMORY CELL IN ONE CLOCK CYCLE

BACKGROUND

The present invention relates to memory circuits.

Programmable logic devices ("PLDs") (also sometimes referred to as complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"), or by other names), are well-known integrated circuits that provide the advantages of fixed integrated circuits with the flexibility of custom integrated circuits. Such devices typically provide an "off the shelf" device having at least a portion that can be programmed to meet a user's specific needs. Application specific integrated circuits ("ASICs") have traditionally been fixed integrated circuits. However, it is possible to provide an ASIC that has a portion or portions that are programmable. Thus, it is possible for an integrated circuit device to have qualities of both an ASIC and a PLD. The term PLD as used herein will be considered broad enough to include such devices.

PLDs have configuration elements that may be programmed or reprogrammed. Configuration elements may be realized as random access memory ("RAM") bits, flip-flops, electronically erasable programmable read-only memory ("EEPROM") cells, or other memory elements. Placing new data into the configuration elements programs or reprograms the PLD's logic functions and associated routing pathways. Configuration elements that are field programmable are often implemented as RAM cells (sometimes referred to a "configuration RAM" ("CRAM")). However, many types of configurable elements may be used including static or dynamic RAM ("SRAM" or "DRAM"), electrically erasable read-only memory ("EEROM"), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

In the typical FPGA embedded memory application, only read or write is performed on the same memory address (i.e., memory cell) during one clock cycle. Read can read the data value at the address location. Write can write new data into the address location. If the user wants to read the data value from the current address location, then write the new data into the same address location, two clock cycles are needed.

In order to support reading the old data then writing the new data to the same address location in one clock cycle, the bitlines need to be pre-charged to the supply voltage twice during the clock cycle. The first time, they are pre-charged to the supply voltage before the read operation. The second time, they are pre-charged to the supply voltage between the read operation and the write operation. Thus, once the read operation is completed, the bitlines are again pre-charged to the supply voltage and thereafter the write operation is performed.

Performing two pre-charge operations consumes additional power, involves additional design complexity, and increases the time required for the read/write operations.

SUMMARY

In one aspect, an embodiment of the present invention provides a memory circuit where data is read from and written to the memory cell in one clock cycle via a port without pre-charging the port between read and write operations. In another aspect, an embodiment of the present invention provides a memory circuit with a write control switch that has a voltage drop of substantially zero volts. In another aspect, an embodiment of the present invention provides a memory circuit with a write driver that uses a complementary metal oxide semiconductor ("CMOS") inverter whose P-channel MOS ("PMOS") transistor size is approximately 0.5 times its N-channel MOS ("NMOS") transistor size. In yet another aspect, an embodiment of the present invention provides a memory circuit with a latch-type read sense amplifier.

An embodiment of the present invention allows reading data from and writing data to a memory cell in one clock cycle with less power and at a higher clock frequency. It also allows using a circuit design of lower complexity.

BRIEF DESCRIPTION OF THE DRAWINGS

The novel features of the invention are set forth in the appended claims. However, for purpose of explanation, several aspects of a particular embodiment of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
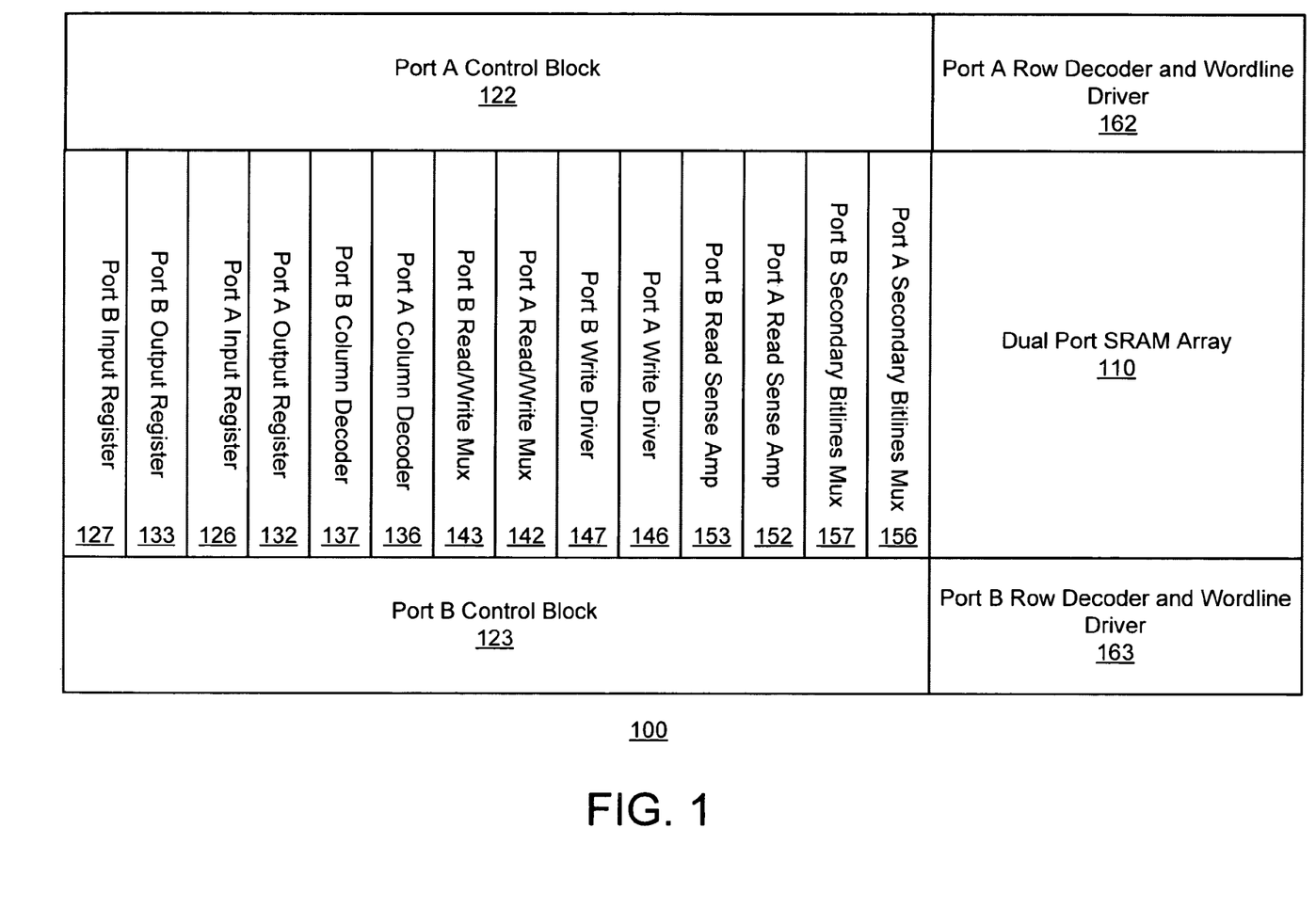
FIG. 1 is a block diagram of one embodiment of a dual port memory block of the present invention.

FIG. 1 is a block diagram of one embodiment of a dual port memory block of the present invention. In FIG. 1, dual port memory block 100 includes dual port memory array 110. Dual port memory array 110 includes multiple memory cells (not shown in FIG. 1) for storing data. In one embodiment, the memory cells of dual port memory array 110 are arranged in an M by N grid, where M and N are integers and respectively represent the number of rows and columns of memory cells in dual port memory array 110. In one embodiment, M is 64 and N is 18. In another embodiment, M may be 128 or 256 and N may be 36 or 72. It is to be noted that the above sizes for dual port memory array 110 are only exemplary and that the present invention is not limited to memory arrays having the sizes enumerated above. In one embodiment, dual port memory array 110 is a dual port SRAM array.

Dual port memory block 100 includes ports A and ports B. In one, embodiment, each memory cell in dual port memory array has associated therewith a port A and a port B.

In one embodiment, dual port memory block 100 includes the following components associated with ports A: port A control block 122, port A input register block 126, port A output register block 132, port A column decoder block 136, port A read/write multiplexor block 142, port A write driver block 146, port A read sense amplifier block 152, port A secondary bitlines multiplexor block 156, and port A row decoder and wordline driver block 162. Dual port memory block 100 also includes the following components associated with ports B: port B control block 123, port B input register block 127, port B output register block 133, port B column decoder block 137, port B read/write multiplexor block 143, port B write driver block 147, port B read sense amplifier block 153, port B secondary bitlines multiplexor block 157, and port B row decoder and wordline driver block 163.

Port A control block 122 controls the operation of the other port A blocks of dual port memory block 100. More specifically, port A control block 122 controls the state of signals and switches in port A blocks, as described in greater detail in reference to FIGS. 2 and 5 below. Port A input register block 126 receives data to be written, via ports A of memory cells in dual port memory array 110. Similarly, port A output register block 132 receives data read via ports A of memory cells in dual port memory array 110. Port A column decoder block 136 decodes the addressed column associated with ports A. Port A read/write multiplexor block 142 selects the width of the input/output data paths for transfer between port A column decoder block 136 and port A read sense amplifier block 152 or port A write driver block 146. The width of the input/output data paths may be 1-bit wide, 2-bit wide, 4-bit wide, etc., and is determined based on the configuration data for selecting the width. Port A write driver block 146 drives data to ports A of memory cells in dual port memory array 110. Port A read sense amplifier block 152 reads data from ports A of memory cells in dual port memory array 110. Port A secondary bitlines multiplexor block 156 selects between coupling port A write driver block 146 or port A read sense amplifier block 152 to memory cells in dual port memory array 110. For a read only operation via ports A, only port A read sense amplifier block 152 is coupled to memory cells in dual port memory array 110. Similarly, for a write only operation via ports A, only port A write driver block 146 is coupled to memory cells in dual port memory array 110. For read and write operations via ports A, port A read sense amplifier block 152 and port A write driver block 146 are coupled to memory cells in dual port memory array 110 during only the read operation and the write operation, respectively. Port A secondary bitlines multiplexor block 156 also selects the column to couple to port A write driver block 146 or port A read sense amplifier block 152. Port A row decoder and wordline driver block 162 decodes the addressed row (or rows in case of multi-bit input/output data paths) of dual port memory array 110 for ports A operation. Port A row decoder and wordline driver block 162 also drives the wordline switches for ports A. Similarly, each of the components associated with port B performs the same operations as its counterpart port A component, but with respect to ports B rather than ports A.

In one embodiment, dual port memory block 100 supports both a simple dual port ("SDP") mode, i.e., a single read operation at one location and a single write operation to another location may be performed at any time, and a true dual port ("TDP") mode, i.e., any combination of two port operations, namely, two reads, two writes, or one read and one write may be performed at two different locations at any time.

Figure 2:
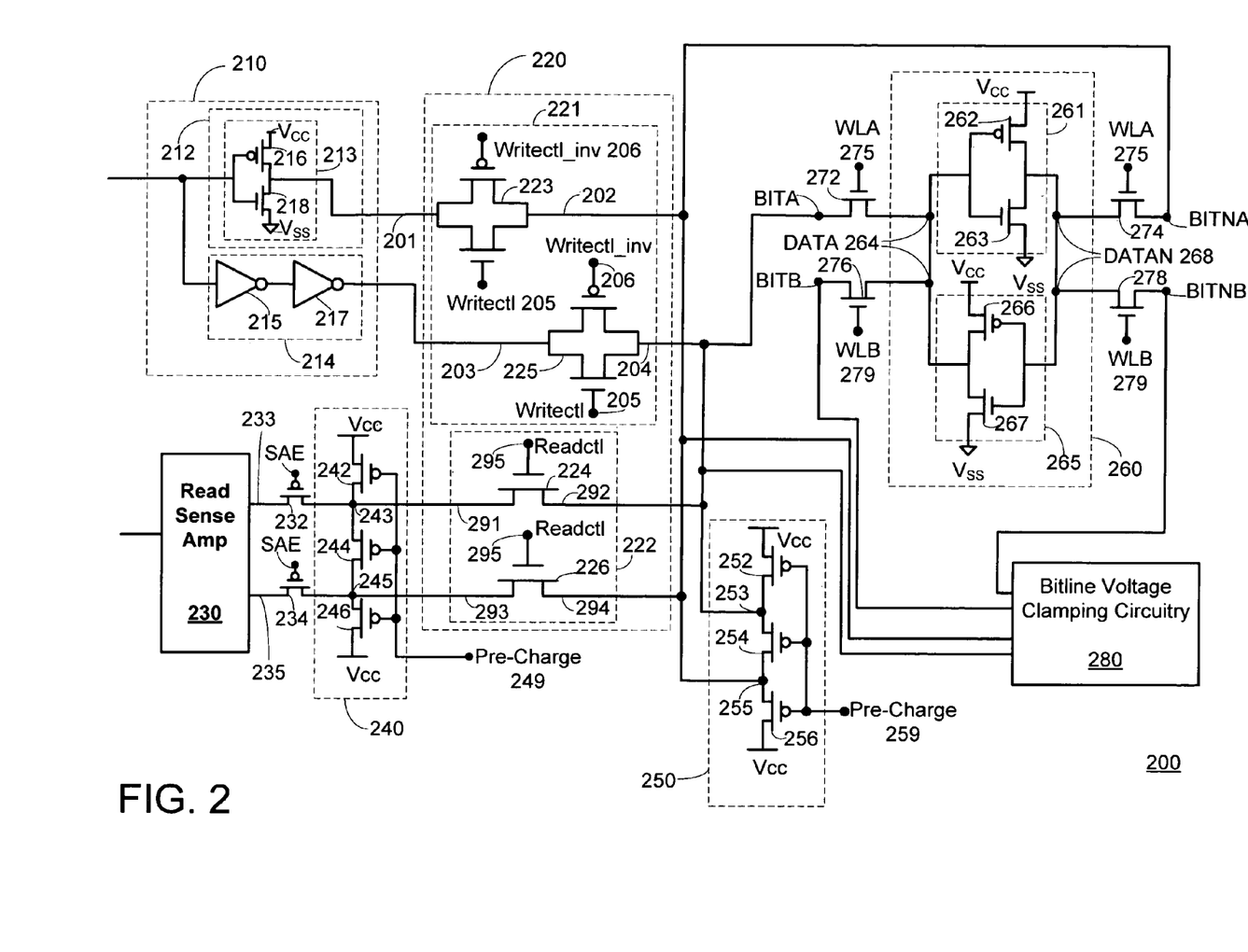
FIG. 2 is a detailed diagram of one embodiment of a memory circuit of the present invention.

FIG. 2 is a detailed diagram of one embodiment of a memory circuit of the present invention. In FIG. 2, memory circuit 200 includes write driver 210, secondary bitlines multiplexor 220, read sense amplifier 230, sense amplifier enabling ("SAE") switches 232 and 234, pre-charge circuits 240 and 250, memory cell 260, wordline switches 272, 274, 276, and 278 (which may also herein be referred to as wordline enabling switches 272, 274, 276, and 278 or port A wordline switches 272 and 274 and port B wordline switches 276 and 278), and bitline voltage clamping circuitry 280.

Write driver 210 is one of the write drivers in port A write driver block 146 (shown in FIG. 1) and is associated with memory cell 260. Write driver 210 includes first path 212 and second path 214. First path 212 includes inverter 213. Second path 214 includes inverters 215 and 217. Inverter 213 inverts the input data received by writer driver 210 and sends the inverted data to the BITNA terminal which is coupled to DATAN terminal 268 of memory cell 260. Inverters 215 and 217 are coupled in series and send the input data to the BITA terminal which is coupled to DATA terminal 264 of memory cell 260.

In one embodiment, inverter 213 is a CMOS inverter which includes PMOS transistor 216 and NMOS transistor 218 coupled as shown. Similarly, although not shown due to space limitations, in one embodiment, inverters 215 and 217 are also CMOS inverters, each of which includes a PMOS transistor and an NMOS transistor coupled in a manner identical to the coupling of PMOS transistor 216 and NMOS transistor 218. In one embodiment, for each of inverters 213 and 217, the PMOS transistor size is approximately equal to 0.5 times the NMOS transistor size. Also, in one embodiment, for inverter 215, the PMOS transistor size is approximately equal to 2 times the NMOS transistor size. This makes inverters 213, 215, and 217 more powerful than those with a lower PMOS transistor size to NMOS transistor size ratios, also referred to herein as P/N ratios. As a result, inverters 213, 215, and 217 are better suited than inverters with lower P/N ratios to drive a desired data into memory cell 260.

Secondary bitline multiplexor 220 is part of port A secondary bitline multiplexor block 156 (shown in FIG. 1) and is associated with memory cell 260. Secondary bitline multiplexor 220 includes write secondary bitline multiplexor 221 and read secondary bitline multiplexor 222. Write secondary bitline multiplexor 221 includes CMOS pass gates 223 and 225, which may also herein be referred to as CMOS switches 223 and 225 or write control switches 223 and 225. Read secondary bitline multiplexor 222 includes NMOS transistors 224 and 226, which may also herein be referred to as NMOS switches 224 and 226 or read control switches 224 and 226.

CMOS pass gate 223 is coupled to inverter 213 and the BITNA terminal. More specifically, first terminal 201 of CMOS pass gate 223 is coupled to the output terminal of inverter 213, whereas second terminal 202 of CMOS pass gate 223 is coupled to the BITNA terminal. Similarly, CMOS pass gate 225 is coupled to inverter 217 and the BITA terminal. More specifically, first terminal 203 of CMOS pass gate 225 is coupled to the output terminal of inverter 217, whereas second terminal 204 of CMOS pass gate 225 is coupled to the BITA terminal.

The gates of CMOS pass gates 223 and 225 are controlled by Writectl signal 205 (write control signal 205) and Writectl_inv signal 206 (write control inverse signal 206). The state of CMOS pass gates 223 and 225 is determined by the values of Writectl signal 205 and Writectl_inv signal 206. When Writectl signal 205 has a high binary value and Writectl_inv signal 206 has a low binary value, CMOS pass gates 223 and 225 are on. High and low binary values may be represented by $V_{CC}$ and $V_{SS}$, respectively, which are the power supply voltage and ground, respectively. In one embodiment, the power supply voltage is 1.1 volts. It is to be noted that the power supply voltage is not limited to 1.1 volts and may have other values. Alternatively, high and low binary values may be represented by the binary numbers 1 and 0, respectively. When Writectl signal 205 has a low binary value and Writectl_inv signal 206 has a high binary value, CMOS pass gates 223 and 225 are off.

When CMOS pass gate 223 is on, the voltage drop from first terminal 201 to second terminal 202 is substantially zero volts. Similarly, when CMOS pass gate 225 is on, the voltage drop from first terminal 203 to second terminal 204 is substantially zero volts. This is in contrast to a similarly situated NMOS transistor or switch, where the voltage drop across those terminals would be equal to $V_T$, the threshold voltage of the NMOS transistor.

NMOS transistor 224 is coupled to, among other things, SAE switch 232, pre-charge circuit 240, and the BITA terminal. More specifically, a first terminal 291 of NMOS transistor 224 is coupled to SAE switch 232 and pre-charge circuit 240, whereas a second terminal 292 of NMOS transistor 224 is coupled to the BITA terminal. Similarly, NMOS transistor 226 is coupled to, among other things, SAE switch 234, pre-charge circuit 240, and the BITNA terminal. More specifically, a first terminal 293 of NMOS transistor 226 is coupled to SAE switch 234 and pre-charge circuit 240, whereas a second terminal 294 of NMOS transistor 226 is coupled to the BITNA terminal.

The gates of NMOS transistors 224 and 226 are controlled by Readctl signal 295 (read control signal 295). The state of NMOS transistors 224 and 226 is determined by the value of Readctl signal 295. When Readctl signal 295 has a high binary value, NMOS transistors 224 and 226 are on. On the other hand, when Readctl signal 295 has a low binary value, NMOS transistors 224 and 226 are off. When NMOS transistors 224 and 226 are on, the voltages at the BITA and BITNA terminals are passed to SAE switches 232 and 234, respectively.

Read sense amplifier 230 is one of the read sense amplifiers in port A read sense amplifier block 152 (shown in FIG. 1) and is associated with memory cell 260. In one embodiment, read sense amplifier 230 is a latch-type read sense amplifier. In other words, read sense amplifier latches input signals it receives at terminals 233 and 235. Read sense amplifier 230 reads the voltage difference between terminals 233 and 235 and amplifies that difference. Based on the reading of that difference, read sense amplifier 230 determines the value of the data stored in memory cell 260. If the voltage at terminal 233 is greater than that at terminal 235 (i.e., if the voltage at the BITA terminal is greater than the voltage at the BITNA terminal), then the data in memory cell 260 has a high binary value. On the other hand, if the voltage at terminal 235 is greater than that at terminal 233 (i.e., if the voltage at the BITNA terminal is greater than the voltage at the BITA terminal), then the data in memory cell 260 has a low binary value.

SAE switches 232 and 234 are one set of SAE switches in port A read sense amplifier block 152 (shown in FIG. 1) and are associated with memory cell 260. SAE switches 232 and 234 are coupled to read sense amplifier 230. More specifically, SAE switches 232 and 234 are respectively coupled to terminals 233 and 235 of read sense amplifier 230. In one embodiment, SAE switches 232 and 234 are PMOS transistors.

In one embodiment, pre-charge circuit 240 is one of the pre-charge circuits in port A read sense amplifier block 152 (shown in FIG. 1) and is associated with memory cell 260. Pre-charge circuit 240 includes PMOS transistors 242, 244, and 246, which are coupled in series. PMOS transistors 242 and 246 are both coupled to supply voltage $V_{CC}$. Pre-charge circuit 240 is coupled to SAE switches 232 and 234. More specifically, nodes 243 and 245 of pre-charge circuit 240 are respectively coupled to SAE switches 232 and 234. As can be seen in FIG. 2, node 243 is between PMOS transistors 242 and 244; whereas node 245 is between PMOS transistors 244 and 246. NMOS transistors 224 and 226 of secondary bitlines multiplexor 220 are also coupled to nodes 243 and 245, respectively. The gates of PMOS transistors 242, 244, and 246 are coupled to pre-charge signal 249. When pre-charge signal 249 has a low binary value, PMOS transistors 242, 244 and 246 are all on and the supply voltage $V_{CC}$ is supplied to nodes 243 and 245. On the other hand, when pre-charge signal 249 has a high binary value, PMOS transistors 242, 244, and 246 are off and no voltage is supplied from pre-charge circuit 240.

In one embodiment, pre-charge circuit 250 is one of the pre-charge circuits in port A secondary bitlines multiplexor block 156 (shown in FIG. 1) and is associated with memory cell 260. Pre-charge circuit 250 includes PMOS transistors 252, 254, and 256, which are coupled in series. PMOS transistors 252 and 256 are both coupled to supply voltage $V_{CC}$. PMOS transistor 252 is coupled to PMOS transistor 254 at node 253. Similarly PMOS transistor 254 is coupled to PMOS transistor 256 at node 255. Nodes 253 and 255 are coupled to the BITA and BITNA terminals, respectively. Similarly, nodes 253 and 255 are coupled to NMOS transistors 224 and 226, respectively, of secondary bitlines multiplexor 220. The gates of PMOS transistors 252, 254, and 256 are coupled to pre-charge signal 259. When pre-charge signal 259 has a low binary value, PMOS transistors 252, 254 and 256 are all on and the supply voltage $V_{CC}$ is supplied to nodes 253 and 255. The supply voltage $V_{CC}$ is also supplied to the BITA and BITNA terminals, which are coupled to nodes 253 and 255, respectively. On the other hand, when pre-charge signal 259 has a high binary value, PMOS transistors 252, 254, and 256 are off and no voltage is supplied from pre-charge circuit 250 to the BITA and BITNA terminals.

Memory cell 260 is one of the memory cells in dual port memory array 110 (shown in FIG. 1). In one embodiment, memory cell 260 is a dual port memory cell and has associated with it a port A and a port B. In general, a port may include one or more terminals used to read data from or write data to a particular memory cell. In this example, port A includes the BITA and BITNA terminals. Similarly, port B includes the BITB and BITNB terminals. Memory cell 260 includes inverters 261 and 265. In one embodiment, inverter 261 is a CMOS inverter that includes PMOS transistor 262 and NMOS transistor 263 coupled as shown. Similarly, in one embodiment, inverter 265 is a CMOS inverter that includes PMOS transistor 266 and NMOS transistor 267 coupled as shown. Memory cell 260 includes DATA terminal 264 and DATAN terminal 268.

The BITA and BITNA terminals are respectively coupled to the BITA and BITNA bitlines (not shown). In one embodiment, the same BITA and BITNA bitlines are coupled to the BITA and BITNA terminals associated with all memory cells in the same column as memory cell 260, i.e., the M memory cells in dual port memory array 110 (shown in FIG. 1) in the same column as memory cell 260. Similarly, the BITB and BITNB terminals are respectively coupled to the BITB and BITNB bitlines. In one embodiment, the same BITB and BITNB bitlines are coupled to the BITB and BITNB terminals associated with all memory cells in the same column as memory cell 260, i.e., the M memory cells in dual port memory array 110 (shown in FIG. 1) in the same column as memory cell 260.

Wordline switch 272 is coupled to DATA terminal 264 and the BITA terminal, whereas wordline switch 274 is coupled to DATAN terminal 268 and the BITNA terminal. In one embodiment, wordline switches 272 and 274 are NMOS transistors whose gates are coupled to WLA signal 275 (wordline A signal 275). Wordline switches 272 and 274 are one set of the sets of wordline switches in port A row decoder and wordline driver 162 (shown in FIG. 1) and are associated with memory cell 260. Wordline switch 276 is coupled to DATA terminal 264 and the BITB terminal, whereas wordline switch 278 is coupled to DATAN terminal 268 and the BITNB terminal. In one embodiment, wordline switches 276 and 278 are NMOS transistors whose gates are coupled to WLB signal 279 (wordline B signal 279). Wordline switches 276 and 278 are one set of the sets of wordline switches in port B row decoder and wordline driver 163 (shown in FIG. 1) and are associated with memory cell 260.

Write driver 210, secondary bitlines multiplexor 220, read sense amplifier 230, SAE switches 232 and 234, pre-charge circuit 240, pre-charge circuit 250, and wordline switches 272 and 274 are associated with port A. Port B of memory cell 260 also has its own associated write driver, secondary bitlines multiplexor, read sense amplifier, SAE switches, pre-charge circuits, and wordline switches. Some of those components associated with port B, such as wordline switches 276 and 278, are shown in FIG. 2. However, due to space limitations and to avoid complicating the drawings, many other components associated with port B, such as a write driver, a secondary bitlines multiplexor, a read sense amplifier, SAE switches, and pre-charge circuits are not shown in FIG. 2. In one embodiment, the coupling of these port B associated components is identical to those of the corresponding port A associated components shown in FIG. 2.

Below is a brief description of the read and write operations via port A of memory cell 260. Before the read operation, the BITA and BITNA terminals are pre-charged to $V_{CC}$ using pre-charge circuit 250. Similarly, nodes 243 and 245 are pre-charged to $V_{CC}$ using pre-charge circuit 240. After the pre-charging, data is read from memory cell 260 via port A, more specifically the BITA and BITNA terminals of port A. The data is read by read sense amplifier 230 and is transmitted thereto via read control switches 224 and 226, SAE switches 232 and 234, and wordline switches 272 and 274. Thereafter, without pre-charging port A (i.e., the BITA and BITNA terminals of port A or either the BITA terminal or BITNA terminal of port A) or nodes 243 and 245 (or either node 243 or 245), data is written to memory cell 260 via port A, more specifically the BITA and BITNA terminals of port A, in the same clock cycle as the read operation. The data is written to memory cell 260 by write driver 210 via write control switches 223 and 225 and wordline switches 272 and 274. A more detailed description regarding the operation of memory circuit 200 is provided below in reference to FIGS. 2 and 5.

Figure 5:
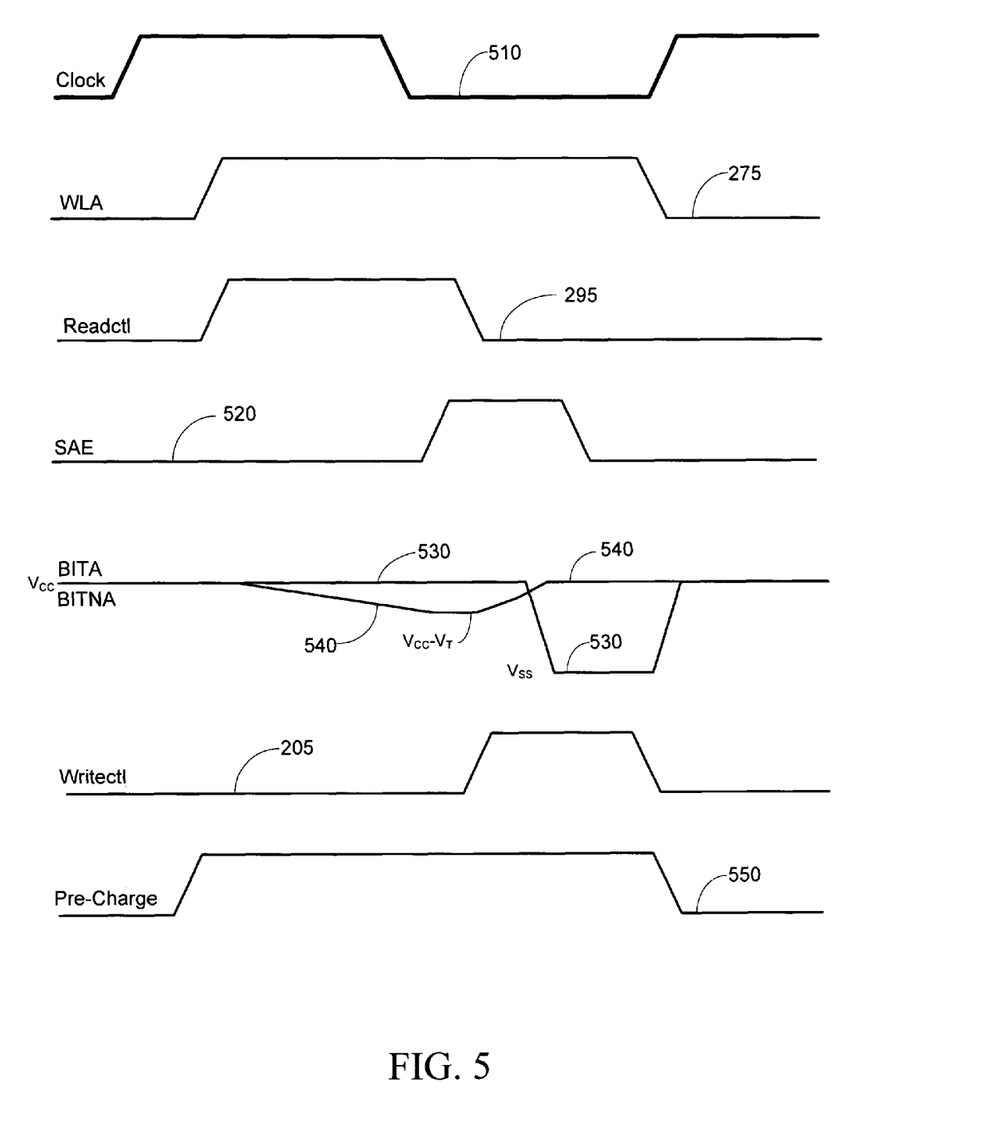
FIG. 5 is an exemplary timing diagram illustrating the relationship between some of the relevant signals in FIG. 2.

Bitline voltage clamping circuitry 280 is to prevent the voltages on the BITA, BITNA, BITB, and BITNB bitlines from becoming too low when not performing a write operation on the memory cells coupled to those bitlines or when not pre-charging those bitlines. It is to be noted (as shown in FIG. 5) that the read operation is performed when not performing a write operation or pre-charging. Thus, the bitline voltage clamping circuitry 280 prevents the voltages on the BITA, BITNA, BITB, and BITNB bitlines from becoming too low during a read operation on the memory cells coupled to those bitlines. Using bitline voltage clamping circuitry 280 allows the writer drivers in write driver blocks 146 and 147 to overcome low voltages at the memory cell ports and bitline capacitances that are present when a write operation is performed via port A during a read operation via port B or when a write operation is performed via port B during a read operation via port A. It is to be noted that bitline voltage clamping circuitry 280 is associated with both port A and port B of memory cell 260. In fact, bitline voltage clamping circuitry 280 is associated with all the memory cells in the same column as memory cell 260 as it is coupled to the BITA, BITNA, BITB, and BITNB bitlines which are coupled to all the ports A and ports B associated with all the memory cells in the same column as memory cell 260. In other words, bitline voltage clamping circuit 280 is used to clamp the bitline voltages for an entire column of memory cells in dual port memory array 110 (shown in FIG. 1). As noted above, dual port memory array 110 has N columns of memory cells, where each column has M memory cells. Thus, bitline voltage clamping circuitry 280 clamps the bitline voltages for all M memory cells in one column. In one embodiment, bitline voltage clamping circuitry 280 is one of the bitline voltage clamping circuitries in port A secondary bitlines multiplexor block 156 (shown in FIG. 1) or port B secondary bitlines multiplexor block 157 (shown in FIG. 1).

Bitline voltage clamping circuitries, such as bitline voltage clamping circuitry 280, are described in greater detail in U.S. patent application Ser. No. 11/506,254 of Haiming Yu et al. entitled "Dual Port Random-Access-Memory Circuitry." They are also described in greater detail below.

Figure 3:
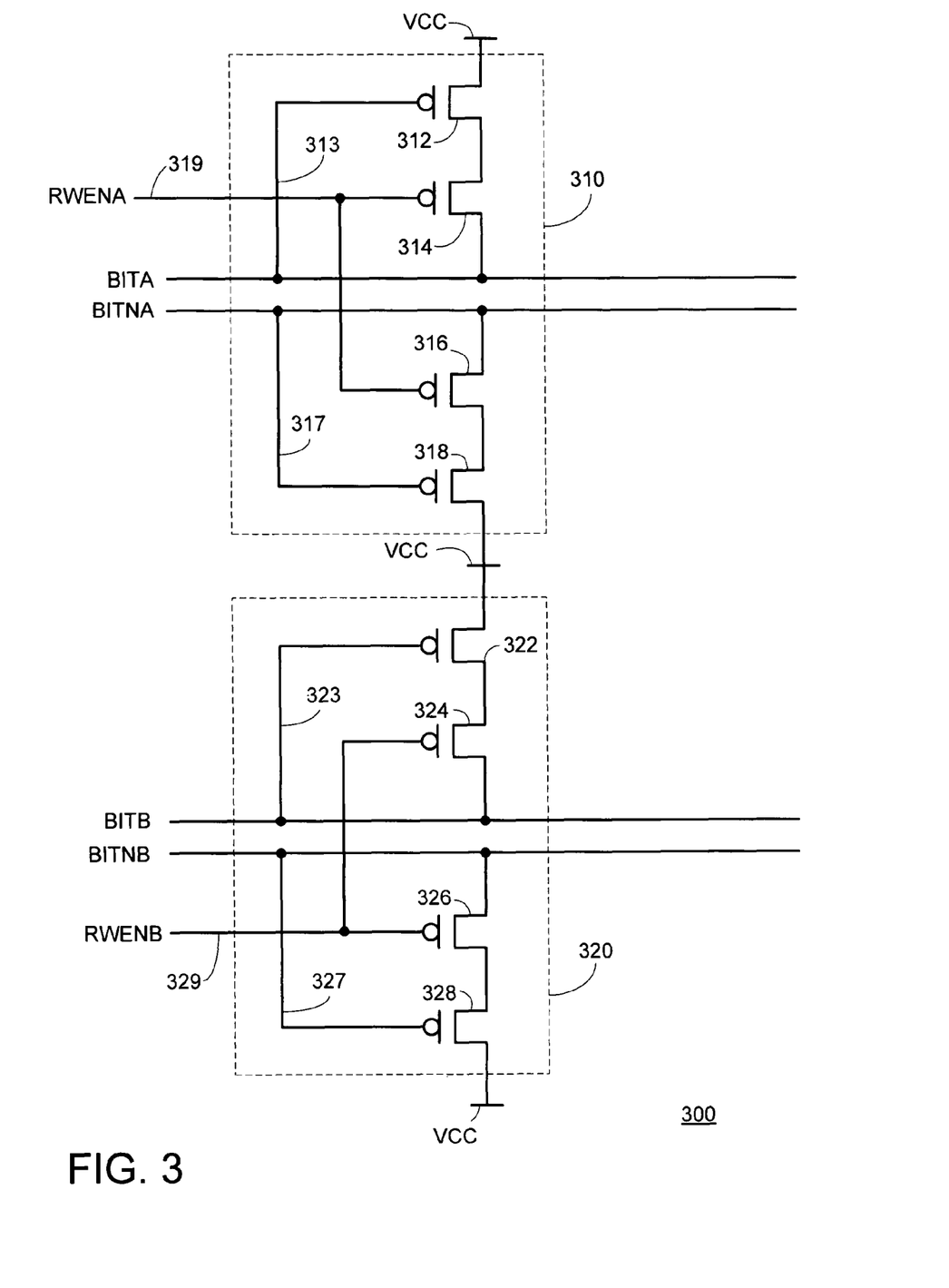
FIG. 3 is a detailed diagram of one embodiment of the voltage clamping circuitry shown in FIG. 2.

FIG. 3 is a detailed diagram of one embodiment of the bitline voltage clamping circuitry shown in FIG. 2. As shown in FIG. 3, bitline voltage clamping circuitry 300 includes clamping circuit 310 for ports A and clamping circuit 320 for ports B. Clamping circuit 310 ensures that the voltages on the BITA and BITNA bitlines do not fall too low when not performing a write operation via port A or pre-charging port A. As noted above, a read operation via port A is performed when not performing a write operation via port A or pre-charging port A. Thus, clamping circuit 310 ensures that the voltages on the BITA and BITNA bitlines do not fall too low during a read operation via port A. Clamping circuit 320 ensures that the voltages on the BITB and BITNB bitlines do not fall too low when not performing a write operation via port B or pre-charging port B. As noted above, a read operation via port B is performed when not performing a write operation via port B or pre-charging port B. Thus, clamping circuit 320 ensures that the voltages on the BITB and BITNB bitlines do not fall too low during a read operation via port B. The bitline voltage clamping circuitry 300 is supplied with a positive power supply voltage $V_{CC}$ at a number of terminals as shown.

Clamping circuit 310 includes PMOS transistors 312, 314, 316, and 318. Clamping circuit 320 includes PMOS transistors 322, 324, 326, and 328. Transistors 314 and 316 in clamping circuit 310 are controlled by the read-write enable signal RWENA on line 319. Transistors 324 and 326 in clamping circuit 320 are controlled by the read-write enable signal RWENB on line 329. Transistors 314, 316, 324, and 326 serve as control transistors that can enable or disable the clamping functions of bitline voltage clamping circuitry 300 as appropriate.

During write operations via port A or pre-charging of port A of any memory cell in the column of memory cells with which bitline voltage clamping circuitry 300 is associated, read-write enable signal RWENA on line 319 has a high binary value, which turns off control transistors 314 and 316 and disables clamping circuit 310. At other times, the read-write enable signal RWENA on line 319 has a low binary value, which turns on control transistors 314 and 316 and enables clamping circuit 310. Thus, during read operations via port A of any memory cell in the column of memory cells with which bitline voltage clamping circuitry 300 is associated, the read-write, enable signal RWENA on line 319 has a low binary value, which turns on control transistors 314 and 316 and enables clamping circuit 310. During write operations via port B or pre-charging of port B of any memory cell in the column of memory cells with which bitline voltage clamping circuitry 300 is associated, read-write enable signal RWENB on line 329 has a high binary value, which turns off control transistors 324 and 326 and disables clamping circuit 320. At other times, the read-write enable signal RWENB on line 329 has a low binary value, which turns on control transistors 324 and 326 and enables clamping circuit 320. Thus, during read operations via port B of any memory cell in the column of memory cells with which bitline voltage clamping circuitry 300 is associated, the read-write enable signal RWENB has a low binary value, which turns on control transistors 324 and 326 and enables clamping circuit 320. The states of the RWENA and RWENB signals are controlled by port A control block 122 and port B control block 123, respectively (both of which are shown in FIG. 1).

In one embodiment, read-write enable signals RWENA and RWENB are generated independently so that clamping circuits 310 and 320 can be enabled and disabled independently. For example, when a write is being performed via port B while a read is being performed via port A, RWENA will have a low binary value to enable bit line voltage clamping on the BITA and BITNA bitlines, while RWENB will have a high binary value to disable voltage clamping on the BITB and BITNB bitlines.

Transistors 312, 318, 322, and 328 serve as voltage regulator transistors. When clamping circuits 310 and 320 are enabled, transistors 312, 318, 322, and 328 are connected between positive power supply voltage $V_{CC}$ and respective bitlines BITA, BITNA, BITB, and BITNB using a feedback arrangement. This ensures that the minimum voltage drop that cap develop on the BITA, BITNA, BITB, and BITNB bitlines is limited to approximately $V_{CC}-V_T$, where $V_T$ is the threshold voltage of each of the transistors 312, 318, 322, and 328. In one embodiment, $V_T$ is approximately 0.35 volts.

As shown in FIG. 3, paths 313, 317, 323, and 327 respectively connect the gates of voltage regulator transistors 312, 318, 322, and 328 to the BITA, BITNA, BITB, and BITNB bitlines, respectively, and form feedback paths. If the voltage on a given one of the BITA, BITNA, BITB, and BITNB bitlines drops below $V_{CC}-V_T$, this loW voltage is passed to the gate of the associated voltage regulator transistor via its associated feedback path 313, 317, 323, and 327. The voltage regulator transistors are PMOS devices, so when a voltage regulator transistor receives a lowered voltage on its gate, it is turned on and its source-drain resistance is lowered. A lowered voltage drop across the source and drain of the voltage regulator transistor that results from the lowered source-drain resistance pulls the bitline high to $V_{CC}-V_T$. If the bitline voltage rises above $V_{CC}-V_T$, the voltage regulator transistor turns off (e.g., to allow the bitlines to be pre-charged to $V_{CC}$).

Figure 4:
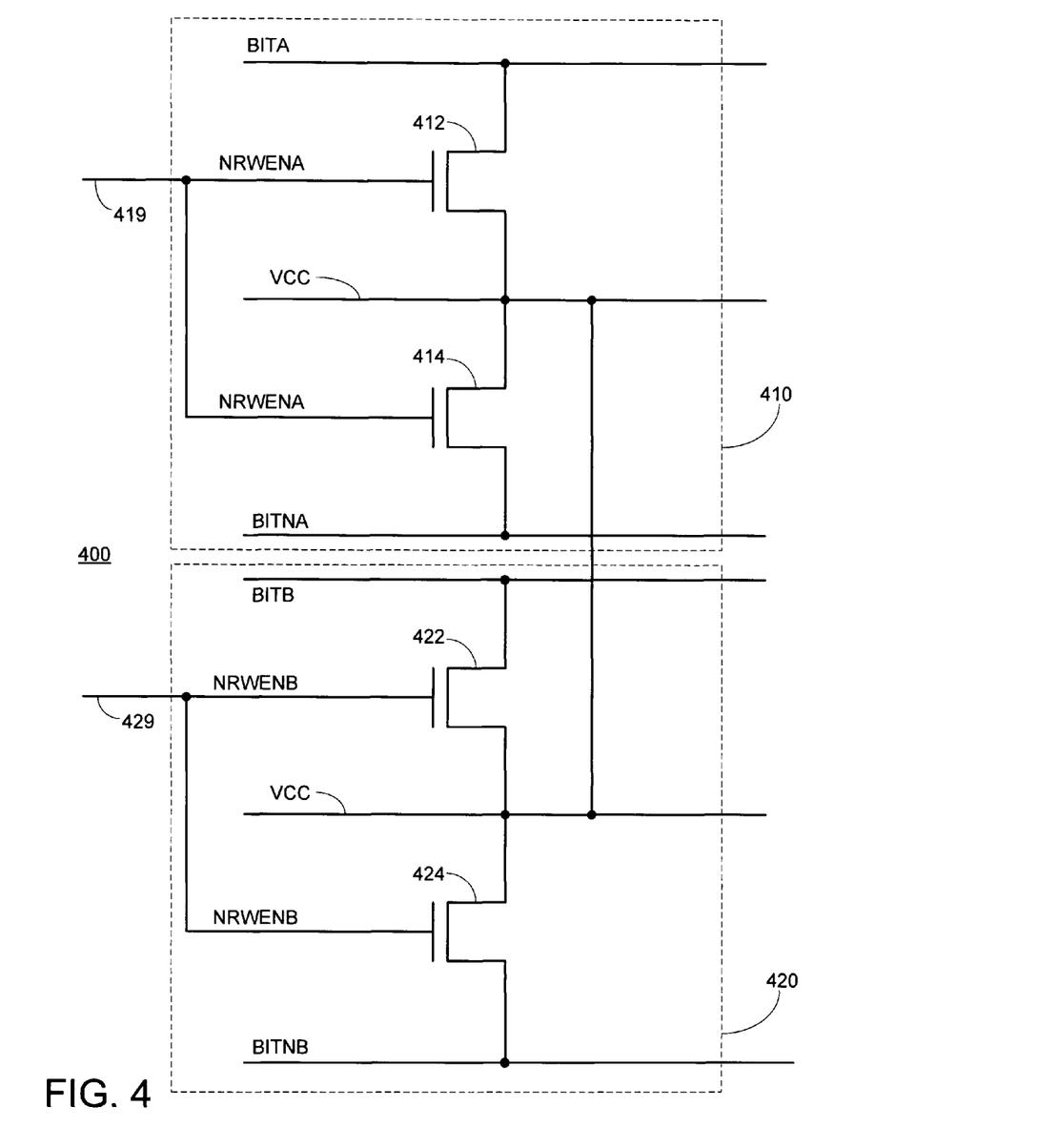
FIG. 4 is a detailed diagram of another embodiment of the voltage clamping circuitry shown in FIG. 2.

FIG. 4 is a detailed diagram of another embodiment of the voltage clamping circuitry shown in FIG. 2. As with bitline voltage clamping circuitry 300 of FIG. 3, bitline voltage clamping circuitry 400 that is shown in FIG. 4 is used to clamp bitline voltages for one of the columns of dual port memory array 110 (shown in FIG. 1).

As shown in FIG. 4, bitline voltage clamping circuitry 400 includes clamping circuit 410 for ports A and Clamping circuit 420 for ports B. Clamping circuit 410 ensures that the voltages on the BITA and BITNA bitlines do not fall too low when not performing a write operation via port A or pre-charging port A. As noted above, a read operation via port A is performed when not performing a write operation via port A or pre-charging port A. Thus, clamping circuit 410 ensures that the voltages on the BITA and BITNA bitlines do not fall too low during a read operation via port A. Clamping circuit 420 ensures that the voltages on the BITB and BITNB bitlines do not fall too low when not performing a write operation via port B or pre-charging port B. As noted above, a read operation via port B is performed when not performing a write operation via port B or pre-charging port B. Thus, clamping circuit 420 ensures that the voltages on the BITB and BITNB bitlines do not fall too low during a read operation via port B.

Clamping circuit 410 includes NMOS transistors 412 and 414. Clamping circuit 420 include's NMOS transistors 422 and 424. Transistors 412 and 414 in clamping circuit 410 are controlled by the complement of read-write enable signal RWENA (called NRWENA) on line 419. Transistors 422 and 424 in clamping circuit 420 are controlled by the complement of read-write enable signal RWENB (called NRWENB) on line 429. Transistors 412 and 414 are activated when it is desired to electrically connect the BITA and BITNA bitlines to positive power supply voltage $V_{CC}$ during clamping operations. Transistors 422 and 424 are activated when it is desired to electrically connect the BITB and BITNB bitlines to positive power supply voltage $V_{CC}$ during clamping operations. The states of the NRWENA and NRWENB signals are controlled by port A control block 122 and port B control block 123, respectively (both of which are shown in FIG. 1).

During write operations via port A or pre-charging of port A of any memory cell in the column of memory cells with which bitline voltage clamping circuitry 400 is associated, the NRWENA signal on line 419 has a low binary value, which turns off transistors 412 and 414 and disables clamping circuit 410. At other times, the NRWENA signal on line 419 has a high binary value, which turns on transistors 412 and 414 and enables clamping circuit 410. As noted above, read operations are performed when not performing write operations or pre-charging. Thus, during read operations via port A of any memory cell in the column of memory cells with which bitline voltage clamping circuitry 400 is associated, the NRWENA signal has a high binary value, which activates transistors 412 and 414 and enables clamping by clamping circuit 410. During write operations via port B or pre-charging of port B of any memory cell in the column of memory cells with which bitline voltage clamping circuitry 400 is associated, the NRWENB signal on line 429 has a low binary value, which turns off transistors 422 and 424 and disables clamping circuit 420. At other times, the NRWENB signal on line 429 has a high binary value, which turns on transistors 422 and 424 and enables clamping circuit 420. Thus, during read operations via port B of any memory cell in the column of memory cells with which bitline voltage clamping circuitry 400 is associated, the NRWENB signal has a high binary value, which activates transistors 422 and 424 and enables clamping by clamping circuit 420.

In one embodiment, the NRWENA and NRWENB signals are generated independently so that clamping circuits 410 and 420 can be enabled and disabled independently. For example, when a write is being performed via port B while a read is being performed via port A, NRWENA will have a high binary value and NRWENB will have a low binary value. This activates transistors 412 and 414 and connects the BITA and BITNA bitlines to $V_{CC}$ to clamp their voltage, while voltage clamping operations are disabled on the BITB and BITNB bitlines.

During clamping, the voltages at the gates of transistors 412 and 414 are held high, i.e., at $V_{CC}$. As explained below, during clamping, if the voltage on the BITA or BITNA bitlines were to fall sufficiently to turn transistors 412 or 414 on, the voltage on the BITA or BITNA bitlines, respectively, would be pulled high by the power supply voltage $V_{CC}$. Transistors 412 and 414 (and transistors 422 and 424) have an associated threshold voltage $V_T$. In one embodiment, $V_T$ is approximately 0.35 volts. If a clamped bitline voltage starts to drop below $V_{CC}-V_T$, the transistor gate-source voltage $V_{GS}$ will start to exceed $V_T$ as the gate voltage is $V_{CC}$. When $V_{GS}$ exceeds $V_T$, the appropriate transistor 412 or 414 will turn on and pull the bitline voltage back towards $V_{CC}$. Accordingly, once enabled by appropriate control signals on lines 419 and 429, transistors 412, 414, 422, and 424 serve as clamping transistors that prevent the voltage on the bitlines from dropping too low. This ensures that write operations via port A that occur during read operations via port B will be successful. Similarly, it ensures that write operations via port B that occur during read operations via port A will be successful.

FIG. 5 is an exemplary timing diagram illustrating the relationship between some of the relevant signals in FIG. 2. Accordingly, the below description is largely in reference to FIGS. 2 and 5. FIG. 5 illustrates examples of clock signal 510, WLA signal 275, Readctl signal 295, SAE signal 520, BITA signal 530, BITNA signal 540, Writectl signal 205, and pre-charge signal 550. In one embodiment, clock signal 510 is the clock signal used in the input/output register blocks and control blocks of the dual port memory block 100 of FIG. 1 (such as port A input/output register blocks 126/132, port B input/output register blocks 127/133, port A control block 122, and port B control block 123). With the exception of clock signal 510, which applies to both port A and port B of memory cell 260, the remaining signals shown in FIG. 5 apply to only port A of memory cell 260. In one embodiment, the states of Readctl signal 295, SAE signal 520, Writectl signal 205, and pre-charge signal 550 are controlled by port A control block 122 (shown in FIG. 1). Port A control block 122 also controls the timing of WLA signal 275, which is used by port A row decoder and wordline driver bock 162 (shown in FIG. 1) to control the wordline switches 272 and 274. The states of counterpart signals for ports B are controlled by port B control block 123 (shown in FIG. 1). Similarly, port B control block 123 also controls the timing of WLB signal 279, which is used by port B row decoder and wordline driver bock 163 (shown in FIG. 1) to control the wordline switches 276 and 278. The states of the BITA signal 530 and BITNA signal 540 reflect the voltages at the BITA and BITNA terminals, respectively. Below is a description of one embodiment of the read and write operations performed on memory cell 260 via port A in one clock cycle without pre-charging port A between the read and write operations.

Before the read operation, nodes 243 and 245 and the BITA and BITNA terminals are pre-charged to $V_{CC}$ by pre-charge circuits 240 and 250, respectively. The pre-charge circuits are switched on by applying a signal that has a low binary value to the gates of the transistors of pre-charge circuits 240 and 250. In other words, they are turned on by applying pre-charge signals 249 and 259 that have a low binary value to pre-charge circuits 240 and 250, respectively. The pre-charging is terminated when pre-charge signals 249 and 259 have a high binary value. In one embodiment, pre-charge signals 249 and 259 are the same signal and are both represented by pre-charge signal 550 of FIG. 5.

Also before the read operation, but after the pre-charging is completed, wordline switches 272 and 274 are switched on. This is accomplished by applying WLA signal 275 that has a high binary value to the gates of wordline switches 272 and 274. As can be seen in FIG. 5, there is some delay between the first rising edge of clock signal 510 and the rising edge of WLA signal 275. The length of this delay depends on the delays of the row address input registers and decoder (which are respectively part of port A input register block 126 (shown in FIG. 1) and port A row decoder and wordline driver block 162 (shown in FIG. 1)), the read/write control (which is part of port A control block 122 (shown in FIG. 1)) and final wordline driver (which is part of port A row decoder, and wordline driver block 162 (shown in FIG. 1)).

Having wordline switches 272 and 274 on allows reading data from and writing data to memory cell 260 via the BITA and BITNA terminals, which are coupled to wordline switches 272 and 274, respectively. Accordingly, WLA signal 275 is maintained high and wordline switches 272 and 274 remain on until both the read and write operations are completed. It is to be noted that WLA signal 275 is not lowered to a low binary value between the read and write operations in a clock cycle. Therefore, wordline switches 272 and 274 are not switched off between the read and write operations. This allows for saving power that would otherwise be spent on switching wordline switches 272 and 274 off and on. It also allows for a simpler control of wordline switches 272 and 274. Additionally, it allows for a quicker transition between the read and write operations. As a result, it allows for memory circuit 260 to operate at a higher clock frequency. In another embodiment, wordline switches 272 and 274 may be switched off and on between the read and write operations by appropriately adjusting WLA signal 275.

When wordline switches 272 and 274 are on, the voltage at the BITA or BITNA terminal is pulled below $V_{CC}$ by the voltage at DATA terminal 264 or DATAN terminal 268, respectively. If the data stored in the memory cell has a low binary value, then the voltages at DATA and DATAN terminals 264 and 268 are $V_{SS}$ and $V_{CC}$, respectively. As a result, when wordline switches 272 and 274 are on, the voltage at the BITA terminal is pulled below $V_{CC}$, whereas the voltage at the BITNA terminal is not. If the data stored in the memory cell has a high binary value, then the voltages at DATA and DATAN terminals 264 and 268 are $V_{CC}$ and $V_{SS}$, respectively. As a result, when wordline switches 272 and 274 are on, the voltage at the BITAN terminal is pulled below $V_{CC}$, whereas the voltage at the BITA terminal is not.

In one embodiment, as shown in FIG. 5, Readctl signal 295 is raised from a low to a high binary value after WLA signal 275 is raised from a low to a high binary value. When Readctl signal 295 has a high binary value, read control switches 224 and 226 are on and transmit the voltages at the BITA and BITNA terminals, respectively, via SAE switches 232 and 234, respectively, to read sense amplifier 230. For most of the time that read control switches 224 and 226 are on, SAE switches 232 and 234 (which are PMOS switches) are also on as SAE signal 520 applied to their gates has a low binary value. When there is sufficient difference between the voltages at the BITA and BITNA terminals, SAE switches 232 and 234 are switched off by raising SAE signal 520 to a high binary value. Similarly, read control switches 224 and 226 are also switched off by lowering Readctl signal 295 to a low binary value. In one embodiment, as shown in FIG. 5, SAE switches 232 and 234 are switched off by raising SAE signal 520 to a high binary value before read control switches 224 and 226 are turned off by lowering Readctl signal 295 to a low binary value. This allows for a quicker transition from the read to the write operation, which allows memory circuit 200 to operate at a higher clock frequency. The delay between raising SAE signal 520 to a high binary value and lowering Readctl signal 295 to a low binary value is controlled by the self-time circuitry (not shown) of port A control block 122 (shown in FIG. 1). Similarly, the delay between raising WLA signal 275 and SAE signal 520 to a high binary value is also controlled by the self-time circuitry.

When SAE switches 232 and 234 are switched off, read sense amplifier 230 is turned on. Read sense amplifier 230 senses the voltage difference between terminals 233 and 235, which also represents the voltage difference between the BITA and BITNA terminals, and stores it. As rioted above, in one embodiment, read sense amplifier 230 is a latch-type read sense amplifier. Accordingly, it does not take as long as a non-latch-type read sense amplifier to sense the voltages at the BITA and BITNA terminals. Moreover, as read sense amplifier 230 is a latch-type read sense amplifier, SAE switches 232 and 234 and read control switches 224 and 226 need not remain on for read sense amplifier 230 to sense the voltages at the BITA and BITNA terminals. Switching off SAE switches 232 and 234 and read control switches 224 and 226 earlier allows for a quicker transition from the read operation to the write operation. As a result, it allows memory circuit 200 to operate at a higher clock frequency.

Based on the relative level of the BITA and BITNA terminal voltages, read sense amplifier 230 determines the state of the data in memory cell 260. As noted above, the DATA and DATAN terminals 264 and 268 of memory cell 260 are coupled to the BITA and BITNA terminals, respectively. Therefore, when the BITA terminal voltage is higher than the BITNA terminal voltage, the data of memory cell 260 has a high binary value. Conversely, when the BITA terminal voltage is lower than the BITNA terminal voltage, the data of memory cell 260 has a low binary value.

After the read operation is completed, write control switches 223 and 225 are turned on by raising Writectl signal 205 from a low to a high binary value. In one embodiment, this transition occurs when SAE switches 232 and 234 are completely turned off or SAE signal 520 is 99% of $V_{CC}$. In one embodiment, Readctl signal 295 is lowered to a low binary value before Writectl signal 205 is raised to a high binary value. In one embodiment, the delay between lowering Readctl signal 295 to a low binary value and raising Writectl signal 205 to a high binary value is as small as possible. As noted above, in one embodiment, write control switches 223 and 225 are CMOS pass gates. As a result, the voltage drop across write control switches 223 and 225 is substantially zero volts. The inverse of the data to be written to memory cell 260 is passed from inverter 213 to the BITNA terminal. Similarly, the data to be written is passed from inverter 217 to the BITA terminal. As wordline switches 272 and 274 are on during the write operation, they transmit the data and inverse data signals from the BITA and BITNA terminals, respectively, to DATA and DATAN terminals 264 and 268, respectively, of memory cell 260.

After the read operation is completed, nodes 243 and 245 and port A are not pre-charged again in the clock cycle of clock signal 510 before the write operation of data to memory cell 260 via port A. In other words, the read and write operations on memory cell 260 via port A are accomplished without pre-charging port A or nodes 243 and 245 between the read and write operations even though they are both performed in one clock cycle. Thus, the present invention allows for performing a read operation and a write operation on a memory cell in one clock cycle using the same port coupled to the memory cell with only one pre-charging of that port during the one clock cycle. This allows saving power that would otherwise be spent on a second pre-charging. It also allows for more quickly transitioning from the read operation to the write operation, which permits the circuit to operate at a higher clock frequency. Additionally, it allows for using a simpler control circuit (in port A control block 122 and port B control block 123) for controlling the pre-charge circuits.

In one embodiment, the BITA and BITNA terminals of port A are not pre-charged between the read and write operations in one clock cycle. Also, in one embodiment, the BITA terminal of port A is not pre-charged between the read and write operations in one clock cycle. Similarly, in one embodiment, the BITNA terminal of port A is not pre-charged between the read and write operations in one clock cycle. In one embodiment, the BITA terminal and the BITNA terminal of port A are pre-charged only once during one clock cycle during which both a read operation and a write operation are performed via port A. Also, in one embodiment, the BITA terminal of port A is pre-charged only once during one clock cycle during which both a read operation and a write operation are performed via port A. Similarly, in one embodiment, the BITNA terminal of port A is pre-charged only once during one clock cycle during which both a read operation and a write operation are performed via port A.

BITA signal 530 and BITNA signal 540 represent the voltages at the BITA and BITNA terminals, respectively. Initially, both the BITA and BITNA terminals are pre-charged to $V_{CC}$. As a result, initially both BITA signal 530 and BITNA signal 540 have a high binary value, i.e., are at $V_{CC}$. When WLA signal 275 has a high binary value, wordline switches 272 and 274 are on. In the example illustrated in FIG. 5, the data initially stored in memory cell 260 has a high binary value. As such, initially the voltage at DATA terminal 264 of memory cell 260 has a high binary value, whereas the voltage at DATAN terminal 268 of memory cell 260 has a low binary value. As the voltage at DATAN terminal 268 has a low binary value, it pulls down the voltage at the BITNA terminal when wordline switch 274 is on. As a result, BITNA signal 540 drops below $V_{CC}$ when WLA signal 275 and Readctl signal 295 have a high binary value, i.e., during the read operation via port A of memory cell 260. The BITNA signal 540 drops to a minimum voltage of $V_{CC}-V_T$ as bitline voltage clamping circuitry 280 clamps the bitline voltages to $V_{CC}-V_T$, as explained above. BITA signal 530 does not change during the read operation because both BITA signal 530 and the voltages at DATA terminal 264 of memory cell 260 have a high binary value.

During the write operation, i.e., when Writectl signal 205 has a high binary value, a new data, in this example a low binary value, is written to memory cell 260 via port A. As a result of writing the low binary value via port A to memory cell 260, BITA signal 530 is lowered to a low binary value, i.e., $V_{SS}$. On the other hand, BITNA signal 540 is raised to a high binary value, i.e., $V_{CC}$. It is to be noted that during the write operation via port A or pre-charging of port A, bitline voltage clamping circuitry 280 is disabled, at least with respect to the port A bitlines, i.e., the BITA and BITNA bitlines. As a result, the voltage at the BITA terminal is allowed to fall below $V_{CC}-V_T$. This permits lowering BITA signal 530 to fall to $V_{SS}$. After both the read and write operations are completed, WLA signal 275 is lowered to a low binary value. Also, after completing the read and write operations and lowering WLA signal 275 to a low binary value, the BITA and BITNA terminals are pre-charged to $V_{CC}$ in the next clock cycle by lowering pre-charge signal 550 to a low binary value. As a result, both BITA signal 530 and BITNA signal 540 are raised to $V_{CC}$.

An embodiment of the present invention reduces the minimum cycle time needed to perform both the read and write operations by approximately 20% and increases the maximum working frequency for the memory circuit by approximately 25%. Similarly, an embodiment of the present invention provides an overall alternating current (AC) power savings of approximately 20% or more for the read before write mode.

Figure 6:
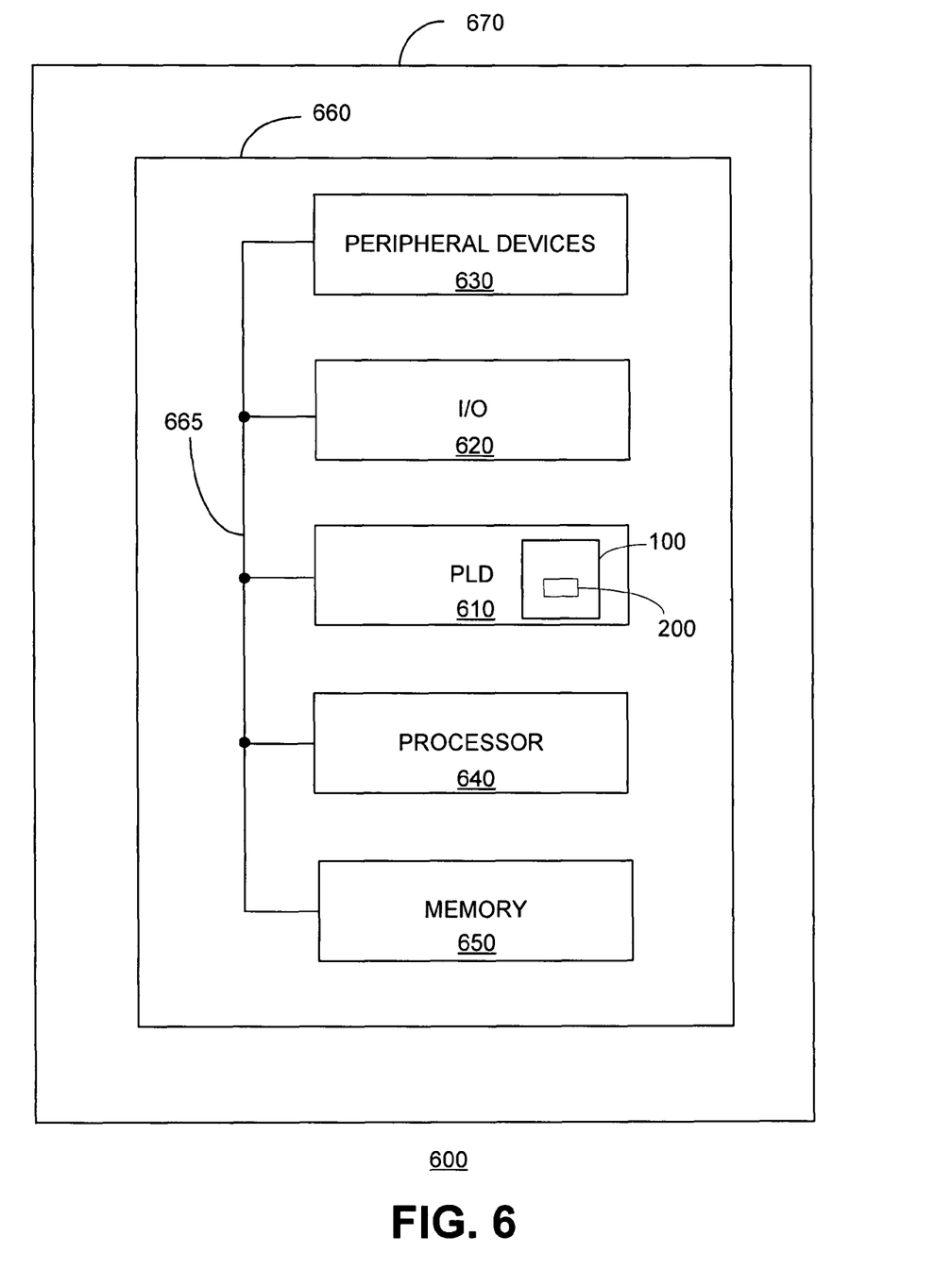
FIG. 6 illustrates an exemplary data processing system including an exemplary PLD in which memory blocks and memory circuits in accordance with the present invention might be implemented.

FIG. 6 illustrates an exemplary data processing system including an exemplary PLD in which memory blocks and memory circuits in accordance with the present invention might be implemented. FIG. 6 illustrates, by way of example, PLD 610 in data processing system 600. As one example, memory circuits (and memory blocks) of this invention may be implemented in memory blocks of PLDs such as PLD 610. In one embodiment, PLD 610 may include a plurality of memory blocks such as dual port memory block 100 (but only one memory block is shown to avoid overcomplicating the drawing). Dual port memory block 100 includes a plurality of memory circuits such as memory circuit 200 (but only one memory circuit is shown to avoid overcomplicating the drawing). In one embodiment, memory circuit 200 and dual port memory block 100 are on the same die/chip as PLD 610. Data processing system 600 may include one or more of the following components: processor 640, memory 650, input/output (I/O) circuitry 620, and peripheral devices 630. These components are coupled together by system bus 665 and are populated on circuit board 660 which is contained in end-user system 670. A data processing system such as system 600 may include a single end-user system such as end-user system 670 or may include a plurality of systems working together as a data processing system.

System 600 can be used in a wide variety of applications, such as computer networking, data networking, instrumentation, video processing, digital signal processing ("DSP"), or any other application where the advantage of using programmable or reprogrammable logic is desirable. PLD 610 can be used to perform a variety of different logic functions. For example, PLD 610 can be configured as a processor or controller that works in cooperation with processor 640 (or, in alternative embodiments, a PLD might itself act as the sole system processor). PLD 610 may also be used as an arbiter for arbitrating access to shared resources in system 600. In yet another, example, PLD 610 can be configured as an interface between processor 640 and one of the other components in system 600. It should be noted that system 600 is only exemplary.

In one embodiment, system 600 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims. For example, although the invention has been described in the context of a memory block and a memory circuit that have dual ports, it may be practiced with memory blocks and memory circuits that have a different number of ports, e.g., a single port.

What is claimed is:

1. A memory circuit comprising:
   a write driver;
   a memory cell coupled to the write driver;
   a first write control switch coupled to the write driver and the memory cell, wherein the first write control switch comprises a first complementary metal oxide semiconductor ("CMOS") pass gate; and
   a second write control switch coupled to the write driver and the memory cell, wherein the second write control switch comprises a second CMOS pass gate;
   wherein data is read from the memory cell and data is written to the memory cell in one clock cycle via a port without pre-charging the port between reading data from the memory cell and writing data to the memory cell via the port in the one clock cycle, and
   wherein the write driver comprises a first driver path including a first inverter, wherein the first inverter is a CMOS inverter that has a P-channel MOS ("PMOS") transistor and an N-channel MOS ("NMOS") transistor with a PMOS transistor size and an NMOS transistor size, respectively, wherein the PMOS transistor size is approximately 0.5 times the NMOS transistor size.

2. The memory circuit of claim 1, wherein data is read from the memory cell and data is written to the memory cell in one clock cycle via the port with only one pre-charging of the port during the one clock cycle.

3. The memory circuit of claim 1,
   wherein the first CMOS pass gate includes a first terminal coupled to the write driver and a second terminal coupled to the memory cell, wherein the first CMOS pass gate has a voltage drop of substantially zero volts between its first and second terminals; and
   wherein the second CMOS pass gate includes a first terminal coupled to the write driver and a second terminal coupled to the memory cell, wherein the second CMOS pass gate has a voltage drop of substantially zero volts between its first and second terminals.

4. The memory circuit of claim 3 further comprising:
   a read sense amplifier, wherein the read sense amplifier is a latch-type sense amplifier and includes a first terminal and a second terminal;
   a first sense amplifier enabling switch coupled to the first terminal of the read sense amplifier; and
   a second sense amplifier enabling switch coupled to the second terminal of the read sense amplifier.

5. The memory circuit of claim 4 further comprising:
   a first read control switch coupled to the first sense amplifier enabling switch; and
   a second read control switch coupled to the second sense amplifier enabling switch.

6. The memory circuit of claim 5, wherein the first and second sense amplifier enabling switches and the first and second read control switches are switched off when the read sense amplifier is turned on and latches a reading from the memory cell.

7. The memory circuit of claim 6 further comprising:
   a first pre-charge circuit coupled to the first write control switch, the second write control switch, the first read control switch, the second read control switch, and a first terminal of the port and a second terminal of the port; and a second pre-charge circuit coupled to the first sense amplifier enabling switch, the second sense amplifier enabling switch, the first read control switch, and the second read control switch.

8. The memory circuit of claim 7 further comprising:
a first wordline switch coupled to the second write control switch, the first read control switch, the first terminal of the port, and a data terminal of the memory cell; and
a second wordline switch coupled to the first write control switch, the second read control switch, the second terminal of the port, and an inverse data terminal of the memory cell;
wherein the first wordline switch and the second wordline switch are not switched off between read and write operations via the port occurring during the one clock cycle.

9. The memory circuit of claim 7, wherein data is read from the memory cell via the port and data is written to the memory cell via the port in the one clock cycle without switching on the first pre-charge circuit and the second pre-charge circuit between reading data from the memory cell via the port and writing data to the memory cell via the port in the one clock cycle.

10. The memory circuit of claim 1, wherein the write driver further comprises:
a second driver path including a second inverter and a third inverter,
wherein each of the second inverter and the third inverter is a CMOS inverter that has a PMOS transistor and an NMOS transistor with a PMOS transistor size and an NMOS transistor size, respectively, wherein, for the third inverter, the PMOS transistor size is approximately 0.5 times the NMOS transistor size and, for the second inverter, the PMOS transistor size is approximately 2 times the NMOS transistor size.

11. The memory circuit of claim 1, wherein the port includes a first terminal and a second terminal, further wherein data is read from the memory cell and data is written to the memory cell in one clock cycle via the first and second terminals of the port without pre-charging the first and second terminals of the port between reading data from the memory cell and writing data to the memory cell via the first and second terminals of the port in the one clock cycle.

12. A memory block including the memory circuit of claim 1.

13. A programmable logic device including the memory circuit of claim 1.

14. A digital system comprising a programmable logic device including the memory circuit of claim 1.

15. A memory circuit comprising:
a writer driver including a first driver path and a second driver path;
a secondary bitlines multiplexor, the secondary bitlines multiplexor comprising:
a first write control switch coupled to the first driver path, wherein the first control switch comprises a complementary metal oxide semiconductor ("CMOS") pass gate;
a second write control switch coupled to the second driver path, wherein the second control switch comprises a CMOS pass gate;
a first read control switch; and
a second read control switch;
a read sense amplifier, wherein the read sense amplifier is a latch-sense amplifier and includes a first terminal and a second terminal;
a first sense amplifier enabling switch coupled to the first terminal of the read sense amplifier;
a second sense amplifier enabling switch coupled to second terminal of the read sense amplifier;
a memory cell coupled to the secondary bitlines multiplexor; and
a first pre-charge circuit coupled to the secondary bitlines multiplexor and the memory cell
wherein the first driver path includes a first inverter, wherein the first inverter is a CMOS inverter that has a P-channel MOS ("PMOS") transistor and an N-channel MOS ("NMOS") transistor with a PMOS transistor size and an NMOS transistor size, respectively, wherein the PMOS transistor size is approximately 0.5 times the NMOS transistor size.

16. The memory circuit of claim 15, wherein data is read from the memory cell and data is written to the memory cell in one clock cycle via a port without pre-charging the port between reading data from the memory cell and writing data to the memory cell via the port in the one clock cycle.

17. The memory circuit of claim 16, wherein the second driver path includes a second inverter and a third inverter, further wherein each of the second inverter and the third inverter is a CMOS inverter that has a PMOS transistor and an NMOS transistor with a PMOS transistor size and an NMOS transistor size, respectively, wherein, for the third inverter, the PMOS transistor size is approximately 0.5 times the NMOS transistor size and, for the second inverter, the PMOS transistor size is approximately 2 times the NMOS transistor size.

18. The memory circuit of claim 17 further comprising:
a second pre-charge circuit coupled to the first sense amplifier enabling switch, the second sense amplifier enabling switch, the first read control switch, and the second read control switch.

19. The memory circuit of claim 18 further comprising:
a first wordline switch coupled to the second write control switch, the first read control switch, a first terminal of the port, and a data port of the memory cell; and
a second wordline switch coupled to the first write control switch, the second read control switch, a second terminal of the port, and an inverse data port of the memory cell;
wherein the first wordline switch and the second wordline switch are not switched off between reading data from the memory cell and writing data to the memory cell in the one clock cycle via the port.

20. The memory circuit of claim 15, wherein the port includes a first terminal and a second terminal, further wherein data is read from the memory cell and data is written to the memory cell in one clock cycle via the first and second terminals of the port without pre-charging the first and second terminals of the port between reading data from the memory cell and writing data to the memory cell via the first and second terminals of the port in the one clock cycle.

21. A memory block including the memory circuit of claim 15.

22. A programmable logic device including the memory circuit of claim 15.

23. A digital system comprising a programmable logic device including the memory circuit of claim 15.

24. A method of performing read and write operations on a memory cell, the method comprising:
pre-charging a port coupled to the memory cell to a supply voltage;
reading a first data from the memory cell during a clock cycle via the port;

writing a second data into the memory cell during the clock cycle via the port without pre-charging the port between the reading and writing, wherein the writing includes sending the second data through a complementary metal oxide semiconductor ("CMOS") pass gate; and sending the second data through a CMOS inverter, wherein the CMOS inverter includes a P-channel MOS ("PMOS") transistor and an N-channel MOS ("NMOS") transistor with a PMOS transistor size and an NMOS transistor size, respectively, wherein the PMOS transistor size is approximately 0.5 times the NMOS transistor size.

25. The method of claim 24, wherein the port is pre-charged only once during the clock cycle.

26. The method of claim 24, wherein the reading comprises:
using a latch-type read sense amplifier to read the first data.

27. The method of claim 26, wherein the reading further comprises:
sending the first data through a sense amplifier enabling switch coupled to the latch-type read sense amplifier, wherein the sense amplifier enabling switch is switched off when the latch-type read sense amplifier is turned on and latches the first data.

28. The method of claim 24, wherein:
the pre-charging comprises pre-charging a first terminal and a second terminal of the port;
the reading comprises reading the first data from the memory cell during a clock cycle via the first terminal and the second terminal of the port; and
the writing comprises writing the second data into the memory cell during the clock cycle via the first terminal and the second terminal of the port without pre-charging the first terminal and the second terminal of the port between the reading and writing.

29. A memory circuit comprising:
a write driver;
a memory cell coupled to the write driver;
a first write control switch coupled to the write driver and the memory cell, wherein the first write control switch comprises a first complementary metal oxide semiconductor ("CMOS") pass gate; and
a second write control switch coupled to the write driver and the memory cell, wherein the second write control switch comprises a second CMOS pass gate;
wherein data is read from the memory cell and data is written to the memory cell in one clock cycle via a port without pre-charging the port between reading data from the memory cell and writing data to the memory cell via the port in the one clock cycle, and
wherein the write driver comprises a first driver path including a first inverter, wherein the first inverter is a CMOS inverter that has a P-channel MOS ("PMOS") transistor and an N-channel MOS ("NMOS") transistor with a PMOS transistor size and an NMOS transistor size, respectively, wherein the PMOS transistor size is approximately 2 times the NMOS transistor size.

30. A memory circuit comprising:
a writer driver including a first driver path and a second driver path;
a secondary bitlines multiplexor, the secondary bitlines multiplexor comprising:
a first write control switch coupled to the first driver path, wherein the first control switch comprises a complementary metal oxide semiconductor ("CMOS") pass gate;
a second write control switch coupled to the second driver path, wherein the second control switch comprises a CMOS pass gate;
a first read control switch; and
a second read control switch;
a read sense amplifier, wherein the read sense amplifier is a latch-type sense amplifier and includes a first terminal and a second terminal;
a first sense amplifier enabling switch coupled to the first terminal of the read sense amplifier;
a second sense amplifier enabling switch coupled to the second terminal of the read sense amplifier;
memory cell coupled to the secondary bitlines multiplexor; and
a first pre-charge circuit coupled to the secondary bitlines multiplexor and the memory cell,
wherein the first driver path includes a first inverter, wherein the first inverter is a CMOS inverter that has a P-channel MOS ("PMOS") transistor and an N-channel MOS ("NMOS") transistor with a PMOS transistor size and an NMOS transistor size, respectively, wherein the PMOS transistor size is approximately 2 times the NMOS transistor size.

31. The memory circuit of claim 30, wherein the first driver path further includes a second inverter, and the second driver path includes a third inverter, further wherein each of the second inverter and the third inverter is a CMOS inverter that has a PMOS transistor and an NMOS transistor with a PMOS transistor size and an NMOS transistor size, respectively, wherein, for second and third inverters, the PMOS transistor size is approximately 0.5 times the NMOS transistor size.

32. A memory circuit comprising:
a write driver;
a memory cell coupled to the write driver;
a first write control switch coupled to the write driver and the memory cell, wherein the first write control switch comprises a first complementary metal oxide semiconductor ("CMOS") pass gate;
a second write control switch coupled to the write driver and the memory cell, wherein the second write control switch comprises a second CMOS pass gate;
a read sense amplifier, wherein the read sense amplifier is a latch-type sense amplifier and includes a first terminal and a second terminal;
a first sense amplifier enabling switch coupled to the first terminal of the read sense amplifier;
a second sense amplifier enabling switch coupled to the second terminal of the read sense amplifier;
a first read control switch coupled to the first sense amplifier enabling switch; and
a second read control switch coupled to the second sense amplifier enabling switch,
wherein the first and second sense amplifier enabling switches and the first and second read control switches are switched off when the read sense amplifier is turned on and latches a reading from the memory cell.

33. The memory circuit of claim 32,
wherein data is read from the memory cell and data is written to the memory cell in one clock cycle via a port without pre-charging the port between reading data from the memory cell and writing data to the memory cell via the port in the one clock cycle.

34. A memory circuit comprising:
a writer driver including a first driver path and a second driver path;
a secondary bitlines multiplexor, the secondary bitlines multiplexor comprising:

a first write control switch coupled to the first driver path, wherein the first control switch comprises a complementary metal oxide semiconductor ("CMOS") pass gate;
a second write control switch coupled to the second driver path, wherein the second control switch comprises a CMOS pass gate;
a first read control switch; and
a second read control switch;
a read sense amplifier, wherein the read sense amplifier is a latch-type sense amplifier and includes a first terminal and a second terminal;
a first sense amplifier enabling switch coupled to the first terminal of the read sense amplifier;
a second sense amplifier enabling switch coupled to the second terminal of the read sense amplifier;
a memory cell coupled to the secondary bitlines multiplexor; and
a first pre-charge circuit coupled to the secondary bitlines multiplexor and the memory cell,
wherein the first and second sense amplifier enabling switches and the first and second read control switches are switched off when the read sense amplifier is turned on and latches a reading from the memory cell.

35. A method of performing read and write operations on a memory cell, the methhod comprising:
pre-charging a port coupled to the memory cell to a supply voltage;
reading a first data from the memory cell during a clock cycle via the port;
writing a second data into the memory cell during the clock cycle via the port without pre-charging the port between the reading and writing, wherein the writing includes sending the second data through a complementary metal oxide semiconductor ("CMOS") pass gate; and
sending the second data through a CMOS inverter, wherein the CMOS inverter includes a P-channel MOS ("PMOS") transistor and an N-channel MOS ("NMOS") transistor with a PMOS transistor size and an NMOS transistor size, respectively, wherein the PMOS transistor size is approximately 2 times the NMOS transistor size.

36. A method of performing read and write operations on a memory cell, the method comprising:
pre-charging a port coupled to the memory cell to a supply voltage;
reading a first data from the memory cell during a clock cycle via the port; and
writing a second data into the memory cell during the clock cycle via the port without pre-charging the port between the reading and writing, wherein the writing includes sending the second data through a complementary metal oxide semiconductor ("CMOS") pass gate;
wherein the reading comprises using a latch-type read sense amplifier to read the first data and sending the first data through a sense amplifier enabling switch coupled to the latch-type read sense amplifier, wherein the sense amplifier enabling switch is switched off when the latch-type read sense amplifier is turned on and latches the first data.

* * * * *